United States Patent
Kathirgamanathan

(10) Patent No.: US 6,717,354 B1
(45) Date of Patent: Apr. 6, 2004

(54) ELECTROLUMINESCENT MATERIALS

(75) Inventor: Poopathy Kathirgamanathan, North Harrow (GB)

(73) Assignee: South Bank University Enterprises Ltd., London (GB)

( * ) Notice: Subject to any disclaimer, the term of this patent is extended or adjusted under 35 U.S.C. 154(b) by 0 days.

(21) Appl. No.: 09/890,431

(22) PCT Filed: Jan. 31, 2000

(86) PCT No.: PCT/GB00/00268
§ 371 (c)(1),
(2), (4) Date: Jul. 30, 2001

(87) PCT Pub. No.: WO00/44851
PCT Pub. Date: Aug. 3, 2000

(30) Foreign Application Priority Data

Feb. 1, 1999 (GB) .................................... 9901971

(51) Int. Cl.$^7$ .................................... H01J 1/62
(52) U.S. Cl. .................... 313/503; 313/504; 428/690; 428/917
(58) Field of Search ................. 313/503, 504; 428/690, 917

(56) References Cited

U.S. PATENT DOCUMENTS

| | | |
|---|---|---|
| 4,356,429 A | 10/1982 | Tang |
| 4,455,364 A | 6/1984 | Sasa |
| 4,720,432 A | 1/1988 | VanSlyke et al. |
| 4,885,211 A | 12/1989 | Tang et al. |
| 5,126,214 A * | 6/1992 | Tokailin et al. ............. 428/690 |
| 5,128,587 A | 7/1992 | Skotheim et al. |
| 5,247,226 A * | 9/1993 | Sato et al. .................. 313/504 |
| 5,281,489 A | 1/1994 | Mori et al. |
| 5,435,937 A | 7/1995 | Bell et al. |
| 5,755,999 A | 5/1998 | Shi et al. |
| 5,757,026 A | 5/1998 | Forrest et al. |

FOREIGN PATENT DOCUMENTS

| | | |
|---|---|---|
| EP | 0087309 | 2/1983 |
| EP | 0278629 | 1/1988 |
| EP | 0461542 | 6/1991 |
| EP | 0556005 | 2/1993 |
| EP | 0569827 | 5/1993 |
| EP | 0744451 | 5/1995 |
| EP | 0936844 | 2/1999 |
| JP | 61037887 | 2/1986 |
| JP | 1-256584 | 10/1989 |
| JP | 1-282291 | 11/1989 |
| JP | 06145146 | 11/1992 |
| WO | 9802018 | 1/1998 |
| WO | 9855561 | 12/1998 |
| WO | 9858037 | 12/1998 |

OTHER PUBLICATIONS

Junji Kido, et al. "Multilayer White Light–Emitting Organic Electroluminescent Device" Science, Mar. 1995, vol. 267, pp. 1332–1334.

U.S. patent application Ser. No. 09/857,287, Kathirgamanathan, filed Jun. 1, 2001.

U.S. patent application Ser. No. 09/857,286, Kathirgamanathan, filed Jun. 1, 2001.

U.S. patent application Ser. No. 09/857,300, Kathirgamanathan, filed Jun. 1, 2001.

(List continued on next page.)

*Primary Examiner*—Ashok Patel
*Assistant Examiner*—Jason Phinney
(74) *Attorney, Agent, or Firm*—Goodwin Procter LLP

(57) ABSTRACT

An electroluminescent material which can form electroluminescent devices which emit light in the ultra-violet region of the spectrum which comprises an organic metallic complex of a transition metal, lanthanide or actinide and a polyamine ligand particularly gadolinium ethylenediaminetetraacetate sodium salt, Na[Gd(EDTA)] and gadolinium europium ethylenediaminetetraacetate salts Gd[Eu(EDTA)]$_3$.

20 Claims, 2 Drawing Sheets

OTHER PUBLICATIONS

N. Armaroli, et al., Luminescence properties of Eu3+, Tb3−, and Gd3+ complexes of the hexafentate N−donor podand tris−[3−(2−pyridyl) pyrazol−ly] hydroborate, Chemical Physical Letters 276 (1997), pp. 435−440.

N.C. Greenham, et al., Measurement of absolute photoluminescence quantum effciencies in conjugated polymers, Chemical Physis Letters, 241 (1995), pp. 89−96.

L. Liu, et al., Europium complexes as emitters in organic electroluminescent devices, Synthetic Metals, 91, 1997, pp. 267−269.

S. Dirr, et al., Luminescence enhancement in microcavity organic structures, Synthetic Metals, 9, 1997, pp. 53−56.

J. Kido, et al., White−Light−Emitting Organic Electroluminescent Device Using Lanthanide Complexes, Japanese Journal of Applied Physics vol. 37, 1996, pp. L394−L396.

K. Hensen, et al., Darstellung Von N−BZW. O−Chlormethylsilyl−Derivaten der Amine 1,2,3,4−Tetrahydro−1−, 10−Phenanthrolin und 8−Hydroxychinolin, Journal of Organometallic Chemistry, 209, (1981), pp. 17−23.

J. Kido, et al., Organic Electoluminescent Devices Using Lanthanide Complexes, Department of Materials Science and Engineering, Yamagata University, Yamagata, Japan, 1995, pp. 110−111.

C.J. Kepert, et al., Structural Systematicsof Rare Earth Complexes. V+ the Hydrated 1:1 Adducts of 2,2':6', 2"−Terpyridine with the Lanthanoid (III) Chlorides, Australian Journal of Chemistry, vol. 47, 1994, pp. 365−384.

K. Machida, et al., Redox Behavior and Luminescence Property ofEuropium Polymer Complexes, Department of Applied Chemistry, Faculty of Engineering, Osaka University, Osaka, Japan, 1991, pp. 70−71.

K. Hayashi, et al., Syntheses and Structural Studies of Lanthanide Mixed Ligand Complexes containingB−diketone, Department of Chemistry, Faculty of Science, Ochanomizu University, Tokyo, Japan 1996, pp. 210−211.

K. Tsuchiya, et al., Complex Formation and its High Dispersion in the Simultaneous Vacuum Deposition of Copper and Phthalocyanine, Faculty of Engineering, Yamagata University, Yomezawa, Japan, 1998, pp. 149−154.

L. K. Templeton, et al., Anomalous Scattering by Praseodymium, Samarium and Gadolinium and Structures of their Ethylenediaminetetraacetate (edta) Salts, Acta. Cryst. (1982). B38, pp. 2155−2159.

J. Kido, et al., Bright red light−emitting organic electroluminescent devices having a europium complexes as an emitter, applied Physics Letters, 65. (17), Oct. 24, 1994, pp. 2124−2126.

T. Wakimoto, et al., Organic EL cells with high Luminous efficiency, Applied Surface Science, 13/114 (1997), pp. 698−704.

J. Kido, et al., Electroluminescence in a Terbium Complex, Chemistry Letters, The Chemical Society of Japan, 1990, pp. 657−660.

U.S. patent application Ser. No. 09/830,897, Kathirgamanathan, filed May 2, 2001.

U.S. patent application Ser. No. 09/466,523, Kathirgamanathan, filed Dec. 17, 1999.

Y. Hamada, et al., Blue Electroluminescence in Thin Films of Azomethin−Zinc Complexes, Japanese Journal of Applied Physics, 32 (1993), pp. L511−L513.

M. Berggren, et al., Ultraviolet Electroluminescence from an Organic Light Emitting Diode, 6156 Advanced MAterials, 7 (1995) Nov., No. 11, pp. 900−903.

* cited by examiner

ELECTROLUMINESCENT MATERIALS

This application is a national stage application of PCT/GB00/00268 which was published in English under publication number WO 00/44851 oil Aug. 3, 2001.

The present invention relates to electroluminescent materials which can emit light in the ultra-violet region of the spectrum and devices made using such materials.

BACKGROUND OF THE INVENTION

Materials which emit light when an electric current is passed through them are well known and used in a wide range of display applications and organic polymers have been proposed as useful in electroluminescent devices, but using these polymers it is not possible to obtain pure colours, they are expensive to make and have a relatively low efficiency.

Another compound which has been proposed is aluminium quinolate, but this requires dopants to be used to obtain a range of colours and has a relatively low efficiency.

In an article in Chemistry letters pp 657–660, 1990 Kido et al disclosed that a terbium (III) acetyl acetonate complex was green electroluminescent and in an article in Applied Physics letters 65 (17) Oct. 24, 1994 Kido et al disclosed that a europium (III) triphenylene diamine complexes was red electroluminescent but these were unstable in atmospheric conditions and difficult to produce as films.

The complexes disclosed in these articles had a relatively low photoluminescent efficiency and were only able to produce green or red light and other colours could not be produced.

Patent Applications WO 98/58037 and WO 98/55561 disclose electroluminescent materials which emit light in the visible spectrum and disclose electroluminescent devices incorporating these materials.

The wavelength of the emitted light from an organo metallic complex which is an electroluminescent material depends on the metal or metals and the ligands.

In general the shorter the wavelength of the emitted light the harder it is to obtain effective electroluminescent materials and in particular electroluminescent materials which emit light in the ultra-violet region of the spectrum have hitherto not been possible to produce.

An electroluminescent material which can emit ultra-violet light would have a range of applications and would enable there to be a source of ultra-violet light without the need for high temperature or complex high energy or vacuum equipment and so could replace such sources of ultra-violet light.

For example, there are devices and displays etc. where ultra-violet light is used to excite other materials to cause these other materials to fluoresce in the visible spectrum.

For example, there are devices and displays etc. where ultra-violet light is used to excite other materials to cause these other materials to fluoresce in the visible spectrum.

SUMMARY OF THE INVENTION

We have now devised organo-metallic complexes which can emit ultra-violet light.

According to the invention there is provided an electroluminescent material which emits light in the ultra-violet region of the spectrum which comprises an organic metallic complex of a transition metal, lanthanide or actinide and a polyamine ligand.

The preferred metal is gadolinium in the III state.

Preferred ligands are ethylene diamine tetramine EDTA, DCTA, DTPA and TTHA.

The structural formulae of these compounds in the acetic acid form are shown below.

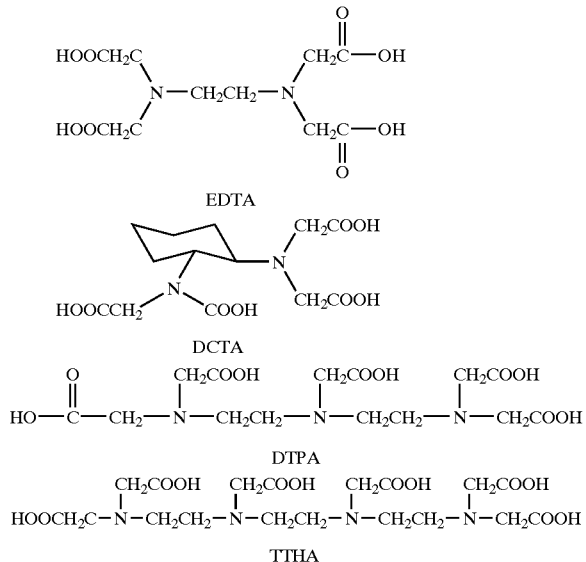

The organo metallic complexes can be made by the reaction of gadolinium chloride with an alkali metal salt of the amine e.g. the sodium salt, for EDTA the reaction is

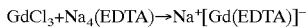

For the other polyamine the corresponding alkali metal salt is used. With polyamines which arc more than tri-functional e.g. EDTA, DCTA, DTPA, TTHA the complexes can be in the form of a salt e.g. an alkali metal salt and can be used in this form. Alternatively a transition metal, lanthanide or actinide salt e.g. Ln*[Ln(EDTA)]$_3$ where Ln and Ln* is a transition metal, lanthanide or actinide and preferably a lanthanide e.g. Gd, Sm, Eu, Tb, Dy, etc.

Particularly preferred mixed complexes are the gadolinium complexes e.g. Gd[Eu(EDTA)]$_3$.

It has surprisingly been found that the lanthanide salts of the organo-metallic complexes exhibit a different electroluminescent spectrum than mixed organ-metallic complexes.

The mixed lanthanide salts can be made by reacting a lanthanide chloride with a lanthanide polyamine complex.

The materials of the present invention can be incorporated into electroluminescent devices which emit ultra-violet light and the invention include such electroluminescent devices.

The materials of the present invention can be incorporated into electroluminescenlt devices which emit ultra-violet light and the invention include such electroluminescent devices.

DETAILED DESCRIPTION OF THE PREFERRED EMBODIMENTS

Figure 1:
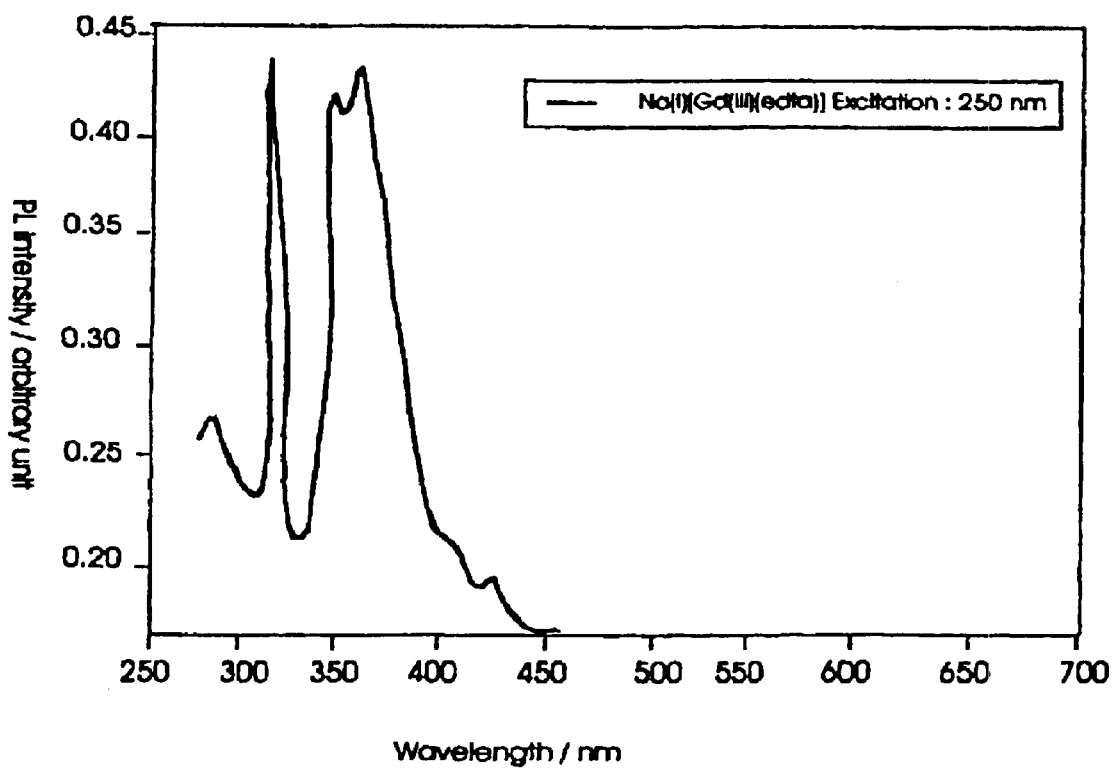
FIG. 1 is a spectrum of gadolinium ethylenediaminetetracetate sodium salt.

The ultra-violet light emitting devices of the invention comprise a transparent substrate which is a conductive glass or plastic material which acts as the anode, preferred substrates are conductive glasses such as indium tin oxide coated glass, but any glass which is conductive or has a conductive layer can be used. Conductive polymers and conductive polymer coated glass or plastics materials can also be used as the substrate. The electroluminescent material can be deposited on the substrate directly by evaporation from a solution of the material in an organic solvent. The solvent which is used will depend the material for example alcohols such as ethanol, ketones such as acetone and methyl acetylacetonate and chlorinated hydrocarbons such as dichloromethane are suitable in many cases.

Alternatively the material can be deposited by spin coating or by vacuum deposition from the solid state e.g. by sputtering or any other conventional method can be used.

In one embodiment there is a hole transporting layer deposited on the transparent substrate and the electroluminescent material is deposited on the hole transporting layer. The hole transporting layer serves to transport; holes and to block the electrons, thus preventing electrons from moving into the electrode without recombining with holes. The recombination of carriers therefore mainly takes place in the emitter layer.

Hole transporting layers are used in polymer electroluminescent, devices and any of the known hole transporting materials in film form can be used.

The hole transporting layer can be made of a film of an aromatic amine complex such as poly(vinylcarbazole), N,N'-diphenyl-N,N'-bis(3-methylphenyl)-I,I'-biphenyl-4,4'-diamine (TPD), polyaniline etc.

Optionally dyes such as fluorescent laser dyes, luminescent laser dyes can be included so that these dyes fluoresce in the ultra-violet light to give emitted light of a particular colour spectrum.

Preferably the electroluminescent material is mixed with a polymeric material such as a polyolefin e.g. polyethylene, polypropylene etc. and preferably polystyrene. Preferred amounts of active material in the mixture is from 95% to 5% by weight of active material and more preferably 25 to 20% by weight.

The hole transporting material can optionally be mixed with the electroluminescent material in a ratio of 5–95% of the electroluminescent material to 95 to 5% of the hole transporting compound. In another embodiment of the invention there is a layer of an electron injecting materials between the cathode and the electroluminescent material layer., Suitable electron injecting materials include a metal complex or oxadiazole or an oxadiozole or an oxadiazole derivative, for example 2-(4-biphenyl-5-(4-tert-butylphenyl)-1,3,4oxadiazole. The electron injecting material is preferably a metal complex such as a metal quinolate e.g. an aluminum quinolate which will transport electrons when an electric current is passed through it. Alternatively the electron injecting material can be mixed with the electroluminescent material and co-deposited with it.

In a preferred structure there is a substrate formed of a transparent conductive material which the anode is on which is successively deposited a hole transportation layer, the electroluminescent material layer and an electron injection layer which is connected to the cathode. The cathode can be any low work function metal, e.g., aluminum, calcium, lithium, silver/magnesium alloys, etc.

There can be a layer or layers containing a fluorescent material in the device so that the ultra-violet light emitted will cause the material to fluoresce and emit light of a particular colour spectrum.

The invention is described in the following examples.

EXAMPLE 1

Gadolinium Ethylenediaminetetraacetate Sodium Salt, Na[Gd(EDTA)]

Gadolinium chloride (10 mmol) was dissolved in water (5 ml). Ethylenediaminetetraacetic acid, tetrasodium salt hydrate (10 mmol) was dissolved in water (10 ml) and added portionwise to the gadolinium chloride solution. The solution became warm, and after ca. 15 minutes, a white precipitate was formed. The mixture was left for a further 2 hours. The precipitate was filtered off to give a white solid which was washed with water (2×5 ml) and dried in air to yield Gadolinium ethylenediaminetetraacetate sodium salt, Na[Gd(EDTA)]

EXAMPLE 2

Gadolinium Europium Ethylenediaminetetraacetate Salts, Gd[Eu(EDTA)]$_3$

Figure 2:
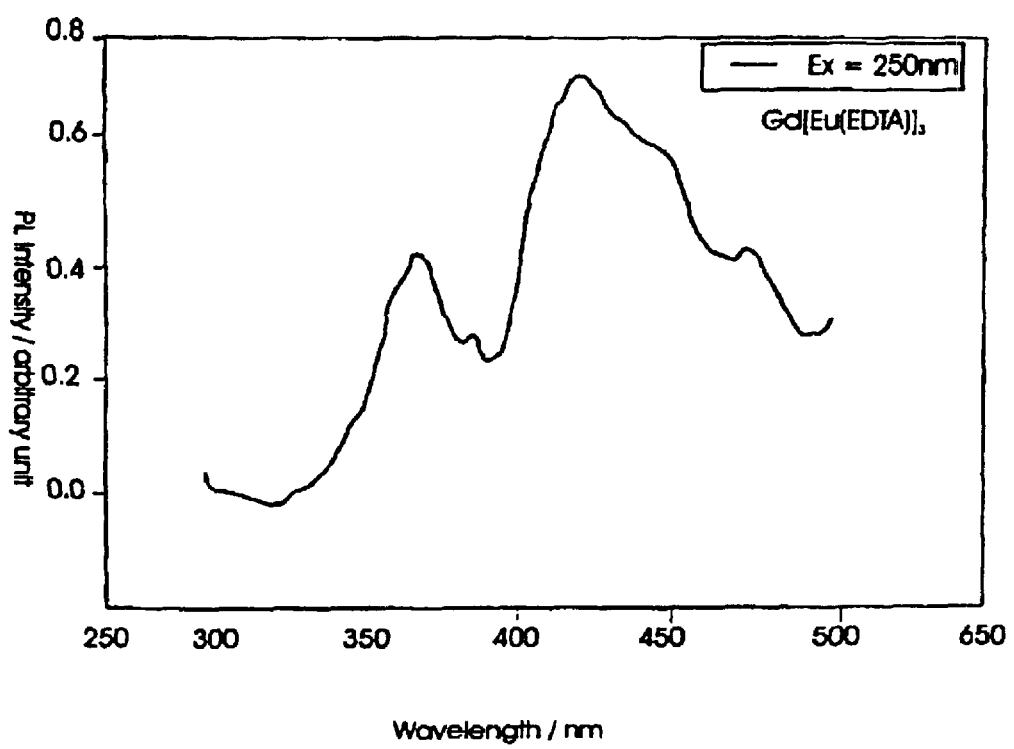
FIG. 2 is a spectrum of gadolinium europium ethylenediametetracetate salt.

Europium ethylenediaminetetraacetate sodium salt Na[Eu(EDTA)] (4.5 mmol) was dissolved in methanol (30 m]). Gadolinium chloride (1.5 mmol) was dissolved in water (5 ml) and added portionwise to the europium ethylenediaminetetraacctate sodium salt solution. A white precipitate was immediately formed. The mixture was left for a further 1 hour. The precipitate was filtered off to give a white solid which was washed with methanol (2×10 ml) and dried in air to yield the product Gadolinium europium ethylenediaminetetraacetate salts, Gd[Eu(EDTA)]$_3$. Phololuminescence was excited using 325 mn line of Liconix 4207 NB, He/Cd laser. The laser power incident at the sample (0.3 mWcm$^{-2}$) was measured by a Liconix 55 PM laser power meter. The radiance calibration was carried out using Bentham radiance standard (Bentham SRS8, Lamp current 4,000A, calibrated by National Physical laboratories, England. The PL studies were carried out on samples or films. The Complexes of the examples were tested and the results shown in the Spectra attached as FIGS. 1 and 2.

An electroluminescent device constructed with a film of the compounds of examples 1 and 2 with an indium coated glass as anode and an aluminium cathode emitted light in the ultra-violet spectrum when a low voltage was applied across the film. The light was emitted in the same spectrum ranges as in FIGS. 1 and 2.

What is claimed is:

1. An electroluminescent material which emits light in the ultra-violet region of the spectrum which comprises an organic metallic complex having a formula Ln*[Ln(polyamine)]$_3$ wherein Ln and Ln* are the same or different and are selected from the group consisting of transition metals, lanthanides and actinide, and wherein the polyamine is selected from the group consisting of ethylene diamine tetramine, DCTA, DTPA and TTHA.

2. An electroluminescent material as claimed in claim 1 in which Ln and Ln* are selected from the group consisting of Gd, Sm, Eu, Tb and Dy.

3. An electroluminescent material as claimed in claim 1 wherein the complex is Gd[Eu(EDTA)]$_3$.

4. An electroluminescent device which comprises sequentially (i) a first electrode comprising a transparent conductive substrate (ii) a layer of an electroluminescent material which emits light in the ultra-violet region of the spectrum and which comprises an organic metallic complex selected from the group consisting of Gd[Ln(polyamine)]$_3$ and M[Gd(polyamine)] wherein M is an alkali metal and wherein Ln is selected from the group consisting of a transition metal, lanthanide and actinide and (iv) a metal electrode.

5. An electroluminescent device as claimed in claim 4 in which the transparent substrate is a conductive glass or plastic material which acts as the anode.

6. An electroluminescent device as claimed in claim 4 in which there is a hole transporting material mixed with the electroluminescent material in a ratio of 5 to 95% of the electroluminescent material to 95 to 5% of the hole transporting material.

7. An electroluminescent device as claimed in claim 4 in which the hole transporting material is an aromatic amine complex.

8. An electroluminescent device as claimed in claim 4 in which the hole transporting material is selected from the group consisting of poly(vinylcarbazole), N,N'diphenyl-N,N'-bis(3-methylphenyl)-1,1'-biphenyl-4,4'-diamine (TPD) and polyaniline.

9. An electroluminescent device as claimed in claim 4 in which an electron injecting material is mixed with the electroluminescent material and co-deposited with it.

10. An electroluminescent device as claimed in claim 9 in which the electron injecting material is selected from the group consisting of a metal complex oxadiazole and an oxadiazole derivative.

11. An electroluminescent device as claimed in claim 10 in which the electron injecting material is selected from the group consisting of an aluminum quinolate and 2-(4biphenyl)-5-(4-tert-butylphenyl)-1,3,4 oxadiazole.

12. An electroluminescent device as in claim 4 in which the metal electrode includes at least one selected from the group consisting of aluminum alloy, magnesium alloy, lithium alloy, calcium alloy and magnesium silver alloy.

13. An electroluminescent device as claimed in claim 4 in which there is at least one layer which incorporates a dye which fluoresces in ultra-violet light to give emitted light in the color spectrum.

14. An electroluminescent material as claimed in claim 1 wherein the organic metallic complex comprises gadolinium in the III state.

15. An electroluminescent device as claimed in claim 4 wherein the organic metallic complex comprises gadolinium in the III state.

16. An electroluminescent device as claimed in claim 15 in which the complex is in the form of a salt.

17. An electroluminescent device as claimed in claim 15 in which the complex is in the form of an alkali metal salt.

18. An electroluminescent device as claimed in claim 4 in which the electroluminescent material is in the form of the salt of formula $Gd[Ln(EDTA)]_3$.

19. An electroluminescent device as claimed in claim 18 in which Ln is selected from the group consisting of Gd, Sm, Eu, Tb and Dy.

20. An electroluminescent device as claimed in claim 4 in which the complex is $Gd[Eu(EDTA)]_3$.

* * * * *